United States Patent
Chang

(10) Patent No.: US 6,514,846 B2
(45) Date of Patent: Feb. 4, 2003

(54) METHOD OF FABRICATING SOLDERING BALLS FOR SEMICONDUCTOR ENCAPSULATION

(76) Inventor: Tao-Kuang Chang, 8F., 28, Lane 490, Hsin Tai Road, Hsinchuang, Taipei Hsien (TW)

(*) Notice: Subject to any disclaimer, the term of this patent is extended or adjusted under 35 U.S.C. 154(b) by 0 days.

(21) Appl. No.: 09/731,730

(22) Filed: Dec. 8, 2000

(65) Prior Publication Data

US 2002/0072213 A1 Jun. 13, 2002

(51) Int. Cl.$^7$ ............................................... H01L 21/44
(52) U.S. Cl. ..................... 438/613; 438/614; 438/616; 438/106; 438/118; 438/685; 438/975
(58) Field of Search ......................... 438/613, 614, 438/615, 616, 612, 975, 106, 656, 685, 688, 118; 75/340, 341, 342, 370; 29/843, 825, 830, 846, 840, 839, 740, 852

(56) References Cited

U.S. PATENT DOCUMENTS 3,652,259 A * 3/1972 Knopp ........................ 75/342
5,653,783 A * 8/1997 Ohzeki ....................... 75/340

* cited by examiner

*Primary Examiner*—Matthew Smith
*Assistant Examiner*—Igwe U. Anya
(74) *Attorney, Agent, or Firm*—Troxell Law Office PLLC

(57) ABSTRACT

A soldering ball fabrication method includes the steps of: (1) drawing a metal wire rod into the desired thickness, (2) cutting the metal wire thus obtained into pieces subject to the desired length, (3) washing the pieces of metal wire to remove dust, (4) processing the pieces of metal wire into balls, (5) washing the balls thus obtained, (6) using a screen to select the balls, (7) inspecting selected balls, and (8) obtaining approved soldering balls.

5 Claims, 1 Drawing Sheet

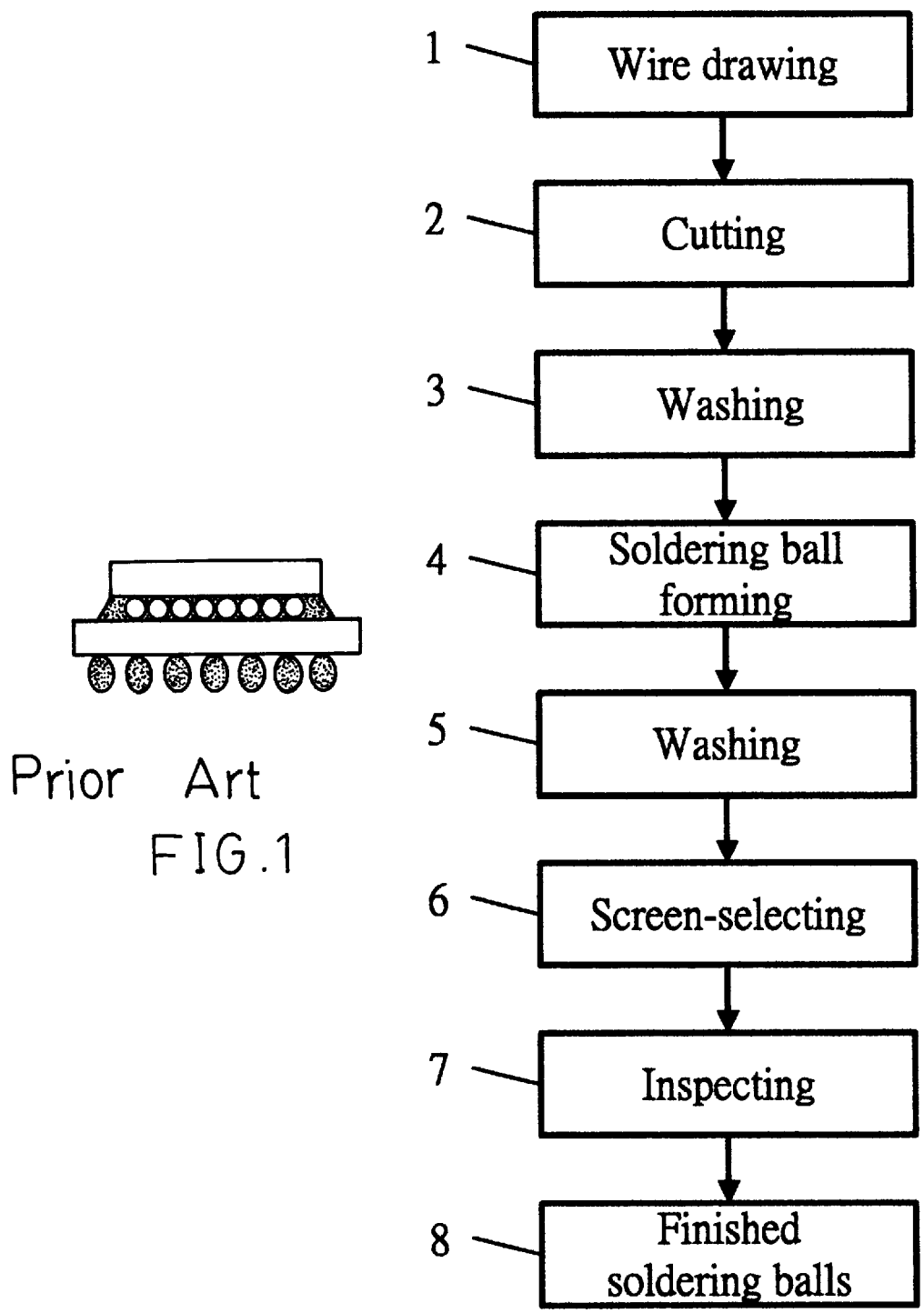

METHOD OF FABRICATING SOLDERING BALLS FOR SEMICONDUCTOR ENCAPSULATION

BACKGROUND OF THE INVENTION

The present invention relates to semiconductor encapsulation and, more specifically, to a method of fabricating soldering balls for semiconductor encapsulation.

Nowadays, BGA and CSP techniques have been popularly used in semiconductor encapsulation. As shown in FIG. 1, soldering balls are provided instead of mounting legs for soldering to the substrate. The application of soldering balls greatly reduces the dimension of the encapsulated semiconductor. However, the quality of soldering balls affects the quality of the semiconductor. Conventionally, the fabrication of soldering balls is to draw a metal wire rod into a thin wire subject to the desired thickness, and then to cut the metal wire into pieces of metal wire, and then to mold the pieces of metal wire into soldering balls. The soldering ball molding procedure is to blow each piece of metal wire through a round mold in a wind tunnel molding apparatus. This method cannot well control the quality of finished soldering balls. After blow molding, fine-protruding portions may form on finished soldering balls in direction of the movement of airflows.

SUMMARY OF THE INVENTION

The present invention provides a soldering ball fabrication method, which eliminates the aforesaid problem. It is one object of the present invention to provide a soldering ball fabrication method, which greatly saves the manufacturing cost. It is another object of the present invention to provide a soldering ball fabrication method, which greatly increases the yield. According to the present invention, a metal wire rod is drawn into the desired thickness and then cut into pieces subject to the desired length, and then the pieces of metal wire are melted and let fall through screens in a vacuum apparatus to form balls, and then the balls are selected and inspected so as to obtain qualified soldering balls.

BRIEF DESCRIPTION OF THE DRAWINGS

FIG. 1 illustrates the application of soldering balls in the encapsulation of a semiconductor device.

FIG. 2 is a block diagram showing the fabrication flow of the present invention.

DETAILED DESCRIPTION OF THE PREFERRED EMBODIMENT

Referring to FIG. 2, the method of the present invention comprises the steps of (1) drawing a metal wire rod into the desired thickness, (2) cutting the metal wire thus obtained into pieces subject to the desired length, (3) washing the pieces of metal wire to remove dust, (4) processing the pieces of metal wire into balls, (5) washing the balls thus obtained, (6) using a screen to select the balls, (7) inspecting selected balls, (8) obtaining approved soldering balls.

The step (1) of drawing a metal wire rod into the desired thickness is to draw a metal wire rod into thickness within about 1000 $\mu$m~0.01 $\mu$m. The metal wire rod can be selected from tin, gold, copper, or their alloy.

The step (4) of processing the pieces of metal wire into balls is to deliver the well-washed pieces of metal wire to a vacuum apparatus having a stack of screens, and then to melt the pieces of metal wire in the vacuum apparatus above the screens, and then to add a lubricating oil to the molten metal before the molten metal falls through rounded open spaces in the screens to form balls. The heating temperature is within about 20° C.~2000° C. subject to the melting point of the pieces of metal wire.

After the pieces of metal wire had been processed into balls, the balls must be well washed, and then selected by means of a screening procedure. Selected balls are inspected. Inspecting items includes roundness, dimension, and soldering reliability. After inspection, the desired soldering balls are obtained.

As indicated above, the soldering ball fabrication method of the present invention is to melt pieces of metal wire, and then to add a lubricating oil to the molten metal, and then to let molten metal fall automatically through screens so as to form the desired balls.

What the invention claimed is:

1. A soldering ball fabrication method comprising the steps of:
   a) drawing a metal wire rod into a predetermined thickness;
   b) cutting the drawn metal wire rod into a plurality of pieces having predetermined lengths;
   c) melting the plurality of pieces in a vacuum apparatus;
   d) passing the molten metal pieces through at least one screen in the vacuum apparatus, the at least one screen having rounded open spaces to form soldering balls;
   e) washing the formed soldering balls; and,
   f) selecting the soldering balls by screening.

2. The soldering ball fabrication method of claim 1 comprising the additional step of adding a lubricating oil to the molten metal pieces before passing the molten metal pieces through the at least one screen.

3. The soldering ball fabrication method of claim 1 wherein the metal wire rod is drawn into a thickness of between 1000 $\mu$m and 0.01 $\mu$m.

4. The soldering ball fabrication method of claim 1 wherein the metal wire rod is selected from a group consisting of tin, gold, copper, tin alloy, gold alloy and copper alloy.

5. The soldering ball fabrication method of claim 1 wherein melting the plurality of pieces is carried out by heating the metal pieces between 20° C. and 2000° C.

* * * * *